United States Patent [19]
Kapur et al.

[11] Patent Number: 6,127,202
[45] Date of Patent: Oct. 3, 2000

[54] OXIDE-BASED METHOD OF MAKING COMPOUND SEMICONDUCTOR FILMS AND MAKING RELATED ELECTRONIC DEVICES

[75] Inventors: Vijay K. Kapur, Tarzana; Bulent M. Basol, Manhattan Beach; Craig R. Leidholm, Woodland Hills; Robert A. Roe, Glendale, all of Calif.

[73] Assignee: International Solar Electronic Technology, Inc., Inglewood, Calif.

[21] Appl. No.: 09/109,814

[22] Filed: Jul. 2, 1998

[51] Int. Cl.⁷ ..................................................... H01L 21/00
[52] U.S. Cl. ................................ 438/47; 438/46; 257/188
[58] Field of Search ........................ 438/47, 46; 253/188; 437/105; 427/76, 255.2

[56] References Cited

U.S. PATENT DOCUMENTS

| | | |
|---|---|---|
| 4,581,108 | 4/1986 | Kapur et al. . |
| 4,798,660 | 1/1989 | Ermer et al. . |
| 5,028,274 | 7/1991 | Basol et al. . |
| 5,445,847 | 8/1995 | Wada et al. ................................ 427/74 |
| 5,728,231 | 3/1998 | Negami et al. ............................ 148/33 |
| 5,871,630 | 2/1999 | Bhattacharya et al. .................. 205/192 |
| 5,985,691 | 11/1999 | Basol et al. ................................ 438/95 |

OTHER PUBLICATIONS

Bloss et al., "Thin Film Solar Cells", Progress in Photovoltaics, vol. 3, pp. 3–24, 1995.
T. Arita et al., "20th IEEE PV Specialists Conference", 1988, pp. 1650–1655.
Vervaet et al., "9th European Communities PV Solar Energy Conference", 1989, p. 480–83.
Casteleyn et al., "12th European PV Solar Energy Conference", 1994, pp. 604–607.
S. Weng and M. Cocivera, "Journal of Applied Physics," vol. 74, pp. 2046–2052, 1993.
M.E. Beck and M. Cocivera, "Thin Solid Films", vol. 272, pp. 71–82, 1996.
Final Technical Report, "Deposition of Copper Indium Diselenide Films by Low–Cost Techniques" Feb., 1987 (by Poly Solar Inc. under SERI subcontract XL–4–03125–1).

*Primary Examiner*—Caridad Everhart
*Assistant Examiner*—Granvill D. Lee
*Attorney, Agent, or Firm*—Fulwider Patton Lee & Utecht, LLP

[57] ABSTRACT

A method for forming a compound film includes the steps of preparing a source material, depositing the source material on a base and forming a preparatory film from the source material, heating the preparatory film in a suitable atmosphere to form a precursor film, and providing suitable material to said precursor film to form the compound film. The source material includes oxide-containing particles including Group IB and IIIA elements. The precursor film includes non-oxide Group IB and IIIA elements. The compound film includes a Group IB-IIIA-VIA compound. The oxides may constitute greater than about 95 molar percent of the Group IB elements and greater than about 95 molar percent of the Group IIIA elements in the source material. Similarly, non-oxides may constitute greater than about 95 molar percent of the Group IB elements and greater than about 95 molar percent of the Group IIIA elements in the precursor film. The molar ratio of Group IB to Group IIIA elements in the source material may be greater than about 0.6 and less than about 1.0, or substantially greater that 1.0, in which case this ratio in the compound film may be reduced to greater than about 0.6 and less than about 1.0. The source material may be prepared as an ink from particles in powder form. The oxide-containing particles may include a dopant, as may the compound film. Compound films including a Group IIB-IVA-VA compound may be substituted using appropriate substitutions in the method. The method, also, is applicable to fabrication of solar cells and other electronic devices.

39 Claims, 9 Drawing Sheets

OXIDE-BASED METHOD OF MAKING COMPOUND SEMICONDUCTOR FILMS AND MAKING RELATED ELECTRONIC DEVICES

This invention was made with United States Government support under NREL Subcontract No. ZAF-5-14142-07, under Contract No. DE-AC02-83CH10093 between the National Renewable Energy Laboratory and the Department of Energy. The United States Government has certain rights in this invention.

TECHNICAL FIELD OF THE INVENTION

This invention relates to methods of making structures incorporating ternary and higher order compound semiconductors, to such structures, and to electronic devices including such structures.

BACKGROUND OF THE INVENTION

Photovoltaics is concerned with direct conversion of light or solar energy into electricity through the use of active electronic devices called solar cells. Solar cells are commonly fabricated on wafers of silicon. However, the cost of electricity generated using silicon-based solar cells is rather high compared with the cost of electricity generated by traditional methods. One way to make photovoltaics competitive with traditional methods of electric power generation is to develop low cost thin film solar cells. This, in turn, requires the development of film growth techniques that can deposit electronically active layers of absorber materials and other components of the solar cells on large area substrates, using cost effective approaches with high materials utilization.

Group IB-IIIA-VIA materials are considered to be highly promising as the absorber layers of high efficiency thin film solar cells. In fact, a comparatively high efficiency thin film device with a conversion efficiency of over 17% has already been produced on a $Cu(In,Ga)Se_2$ absorber film grown by a vacuum evaporation technique.

The electrical and optical properties of Group IB-IIIA-VIA compound films depend on their chemical composition, defect chemistry and structure, which in turn are strongly related to the film growth techniques and parameters. There are a variety of deposition techniques that have been used for the growth of Group IB-IIIA-VIA compound semiconductor films. However, it is crucial to obtain a material that has the good opto-electronic and structural properties which are needed for the production of active electronic devices such as solar cells.

In solar cells based on a Group IB-IIIA-VIA absorber film, appreciable amounts of the binary phases such as Group IIIA-VIA compounds and especially Group IB-VIA compounds in the absorber layer, typically deteriorate the electronic properties of the compound, and thus the characteristics of the solar cells. In addition, it is considered desirable to have an absorber material with columnar grains equivalent to at least about 0.5 $\mu$m diameter, in thin film solar cell structures. Furthermore, for commercial viability, the deposition technique employed should be able to deposit a layer that has a relatively uniform composition onto very large substrates, such as several $ft^2$ in area, using low cost equipment and processes.

An important compositional parameter of Group IB-IIIA-VIA thin films is the molar ratio of the Group IB element or elements to the Group IIIA element or elements. This is commonly referred to as the I/III ratio. Typically an acceptable range of the I/III molar ratio for the Cu-containing Group IB-IIIA-VIA absorber is about 0.8–1.0, although in some cases involving doping with a dopant such as Na, this ratio can go even lower to about 0.6. If the I/III ratio exceeds 1.0 in any part of the absorber film, low resistivity Group IB-VIA phases typically precipitate and deteriorate the performance of the device.

One technique that has yielded relatively good quality Group IB-IIIA-VIA films for solar cell fabrication is co-evaporation of Group IB, IIIA and VIA elements onto heated substrates. As described by Bloss et al. in their review article ("Thin Film Solar Cells", *Progress in Photovoltaics*, vol. 3, page 3–24, 1995), the film growth in this technique takes place in a high vacuum chamber and the evaporation rates of the Group IB and Group IIIA elements are carefully controlled to keep the overall I/III ratio of the film in the acceptable range.

However, the evaporation method is not readily adaptable to low cost production of large area films, mainly because uniform deposition by evaporation on large area substrates is difficult, and the cost of vacuum equipment is high.

Another technique for growing Group IB-IIIA-VIA compound thin films for solar cells is a two-stage process where at least two components of the Group IB-IIIA-VIA material are first deposited on a substrate, and then reacted with each other and/or with a reactive atmosphere in a high temperature annealing process. U.S. Pat. No. 4,581,108 issued to Vijay K. Kapur et al., in 1986, U.S. Pat. No. 4,798,660 issued to James H. Ermer et al., in 1989, and U.S. Pat. No. 5,028,274 issued to Bulent M. Basol et al., in 1991 teach respectively the methods of electrodeposition of Group IB and IIIA elements onto a substrate followed by selenization or sulfidation, DC magnetron sputtering of Cu and In layers on a substrate followed by selenization, and deposition of Group IB and IIIA elements onto a substrate previously coated with a thin Te film followed by selenization or sulfidation. The initial layers deposited on the substrate before the selenization or sulfidation heat treatment steps are commonly referred to as precursor films or layers.

In the two-stage processes, large area magnetron sputtering techniques can be used to deposit individual layers containing Group IB and Group IIIA elements for precursor film preparation. In the case of $CuInSe_2$ growth for example, Cu and In layers can be sputter deposited on non-heated substrates and then the resulting precursor can be selenized in $H_2Se$ gas or Se vapor at an elevated temperature, as is shown in U.S. Pat. Nos. 4,798,660 and 5,028,274.

The techniques employed for the growth of Group IB-IIIA-VIA films require strict control of the material composition during the deposition process, with a typical goal that in the final film, the overall I/III ratio should be in the acceptable range of about 0.80–1.0. For mass production of photovoltaic modules, this ratio should be uniform over large area substrates. Therefore, in the two-stage processes involving deposition of consecutive layers containing the Group IB element and the Group IIIA element or elements, the uniformity and the thickness of each deposited layer has to be controlled.

When the I/III ratio exceeds 1.0, it causes the separation of, e.g., a Cu-sulfide, selenide or telluride phase in exemplary Group IB-IIIA-VIA compound layers where the Group IB element is Cu. Layers containing these phases have low resistivities and typically are not used in active device fabrication. However, these Cu-rich films have good structural characteristics and large grain sizes. The relationship between the structural properties of Group IB-IIIA-VIA materials and their composition can be used beneficially, especially in the co-evaporation approaches, by intentionally increasing the I/III ratio above 1.0 during the film growth process for improving the structural properties of the growing film, and then decreasing it back to the acceptable range by the time deposition process is terminated. Films grown by such approaches often have large grain sizes and good electronic properties. Therefore, it is typically allowable to change the I/III ratio during the deposition and growth of a Group IB-IIIA-VIA compound, but with the overall ratio in the final film being within the 0.8–1.0 range.

Since the uniformity and control of the I/III ratio throughout the film is important for Group IB-IIIA-VIA compounds, attempts have been made to fix this ratio in a material, before the deposition process, and then transfer this fixed composition into the thin film formed using the material. One such attempt to prepare Group IB-IIIA-VIA compound films using a material with a pre-fixed composition was screen printing layers onto substrates and their conversion into the compound. T. Arita et al. in their 1988 publication (20th IEEE PV Specialists Conference, 1988, page 1650) described a screen printing technique that involved: creating an initial material by mixing pure Cu, In and Se powders in the compositional ratio of 1:1:2, milling these powders in a ball mill and forming a screen printable paste, screen printing the paste on a substrate, and sintering this precursor film to form the compound layer. The milling was done in a solvent such as water or ethylene glycol monophenyl ether to reduce the particle size, and formation of a paste was done using a propylene glycol binder. The paste material was deposited on a high temperature borosilicate glass substrate by the screen printing method, forming a film. The post-deposition treatment step consisted of annealing the film in nitrogen gas at 700° C., to form a compound film on the substrate.

For evaluating the photovoltaic characteristics of the resulting compound, thick pellets were made from the material obtained as a result of the milling and sintering steps, and solar cells were fabricated on them. Efficiencies of only about 1% were reported for these devices. The sintering temperature of 700° C. is very high. Such a temperature is expected to cause In loss through vaporization. It would also deform the soda-lime glass substrates used in low cost solar cell structures.

Thin layers of $CuInSe_2$ deposited by a screen printing method were also reported by a research group at Ghent State University in Belgium. A. Vervaet et al., in their 1989 publication (9th European Communities PV Solar Energy Conference, 1989, page 480), referring to the work of T. Arita et al., indicated that indium powder easily oxidizes, giving rise to unwanted phases, such as $In(OH)_3$ or $In_2O_3$ in the final films. The technique of the Ghent research group therefore, employed the steps of: forming a $CuInSe_2$ powder as an initial material by crushing a $CuInSe_2$ ingot; grinding the $CuInSe_2$ powder in a ball mill; adding excess Se powder and other agents such as 1,2-propanediol into the formulation to prepare a screen printable paste; screen printing layers onto borosilicate and alumina substrates; and high temperature sintering of the layers (above 500° C.) to form the compound films. A difficulty in this approach was finding a suitable sintering aid or fluxing agent for $CuInSe_2$ film formation. Among many agents studied, copper selenide was the best for grain growth, but films containing this phase could not be used for active device fabrication since they had I/III ratios larger than 1.0.

More recently, the Ghent group experimented with $CuTlSe_2$, a compound with a relatively low (about 400° C.) melting point, as a fluxing agent. In their 1994 publication (12th European PV Solar Energy Conference, 1994, page 604) M. Casteleyn et al., used $CuTlSe_2$ in their formulation of the $CuInSe_2$ paste, and demonstrated grain growth for films with I/III ratios in the acceptable range. However, the solar cells fabricated on the resulting layers were still poor with conversion efficiencies of only of about 1%. The sintering temperature of above 600° C. used in this process was also high for low cost glass substrates.

Conversion of Group IB-IIIA oxide films into Group IB-IIIA selenide or sulfide layers by reaction in a selenizing or sulfidizing atmosphere has also been investigated. S. Weng and M. Cocivera (Journal of Applied Physics, vol. 74, p. 2046, 1993) and M. E. Beck and M. Cocivera (Thin Solid Films, vol. 272, p. 71, 1996) first formed a copper-indium-oxide film on a substrate by spray pyrolysis of an aqueous solution containing indium-nitrate and copper-nitrate, and subsequently reacted this layer with selenium vapor for up to 12 hours at 400–450° C. to form $CuInSe_2$. They observed a material utilization of 12.5–35% and slight loss of In upon selenization of samples. The resistivities of the p-type films were 1–10 ohm-cm. Apparently, no solar cells were fabricated on these layers. The cited resistivities are low and the material utilization is poor for large scale deposition of films with this specific technique. Reaction times are also prohibitively long. More importantly, as reported by the authors, the I/III ratio control is not very good.

Conversion of oxide films into chalcopyrite layers is also reported in U.S. Pat. No. 5,445,847, issued to T. Wada et al., in 1995. These researchers indicate that in production methods wherein the two stacked layers of the Group IB metal and of the Group IIIA metal are treated with heat under the presence of the chalcogen to obtain a chalcopyrite-type compound, there is a problem in that a deviation is observed in the I/III ratio in the obtained compound, and that the composition itself is not always microscopically constant. The researchers explained their observation by referring to the low melting temperatures of Group IIIA metals. They indicated that when laminated thin films of the Group IB metal and the Group IIIA metal are treated under a chalcogen atmosphere including, for instance, selenium or sulfur, or with a chalcogen-containing gas like $H_2Se$, $CS_2$ or $H_2S$, along with heat, the film of the Group IIIA metal is molten and forms a great number of liquid drops resulting in a heterogeneous layer. As a remedy to this problem Wada et al. used a Group IB-IIIA oxide composition which has a high melting temperature, instead of the metallic layers. They concluded that the Group IB-IIIA oxide composition does not melt from the heat treatment temperature under a reducing atmosphere containing the Group VIA element, and that the initial composition can be maintained in micro-scale. In their reported process, the oxygen atoms contained in the oxide composition are removed in the reducing atmosphere containing the Group VIA element or elements and the oxygen atoms are, at the same time, as part of a single operation, substituted by the atoms of the Group VIA element or elements, avoiding the melting of the Group IIIA metal. This way the chalcopyrite-type compound is synthesized.

More recently, the same research group described a method of including dopants in sputter deposited Group IB-IIIA oxide layers and their conversion into Group IB-IIIA-VIA compounds through selenization (T. Negami et al., U.S. Pat. No. 5,728,231, issued Mar. 17, 1998).

Two-stage processes that involve selenization or sulfidation of Group IB/Group IIIA metallic stacks or Group IB-IIIA alloy layers are known to yield high quality Group IB-IIIA-VIA compounds for device applications. The challenge, however, in employing the two-stage processes in large scale deposition of Group IB-IIIA-VIA films is to control the I/III ratio on large area substrates. In U.S. Pat. No. 4,581,108, for example, electrodeposition was used to deposit Cu and In layers on glass/Mo (glass coated with Mo) substrates. The resulting Cu/In stacked layers were then selenized to obtain $CuInSe_2$ compound layers. To be able to control the Cu/In ratio over large substrates in such a technique requires the control of individual thicknesses of the Cu and In layers, which is difficult to do on large areas by the electroplating approach. U.S. Pat. Nos. 4,798,660 and 5,028,274 use magnetron sputtering or evaporation approaches for the deposition of Cu and In layers which form Cu—In alloy films on the glass/Mo substrates. These alloy films are then selenized to form the desired $CuInSe_2$ compound. Although better suited for large area deposition, the magnetron sputtering technique also needs to be closely controlled to assure a fixed Cu/In ratio over large area substrates. This is very expensive.

In a Final Technical Report, "Deposition of Copper Indium Diselenide Films by Low-Cost Techniques", February, 1987 (by Poly Solar Inc. under SERI subcontract XL-4-03125-1), the researchers in the report explained how they attempted to thermally reduce Cu—In compound films (including oxygen) to form Cu—In alloy layers and then to selenize these metallic alloys to form $CuInSe_2$. They started with the premise that in order to deposit uniform Cu films they had to apply a copper compound to the substrate in the form of a solution. Therefore, since CuO and $Cu_2O$ were insoluble in water, they used $Cu_2O$ and formed a solution in ammonium hydroxide. $In_2O_3$ was colloidally suspended in this solution since it was not soluble. The mixture was then placed on a substrate and chemical reduction was carried out in a hydrogen flow at a substrate temperature of 550° C. By optimizing the process parameters, uniform Cu—In films were reportedly obtained. However, the In content in the films was lower than expected in all cases indicating loss of In during processing. Further, the ammonia solution of $Cu_2O$ was found to be unstable over a period of several days. Therefore, the researchers reported that they discontinued this processing approach.

The above researchers reported another experiment that involved dissolving $Cu(NO_3)_2$ and $In(NO_3)_3$ in methanol and depositing this solution onto a substrate. After drying, the substrate was annealed in hydrogen atmosphere at 550° C. to obtain Cu—In films. The films obtained this way were also found to be In-deficient due to vaporization of In-oxide or In. Therefore, the researchers adjusted the initial stoichiometry to more In-rich compositions so that they could obtain films with Cu/In ratios close to 1.0 after processing. Cu—In films were then selenized in an $H_2+H_2$ Se gas mixture and Cu—In—Se films were obtained. In conclusion, the researchers pointed out two major problems with the techniques they attempted to develop: composition inhomogeneities and the irreproducible resistivity values. It should be noted that these are two of the most important parameters that need to be controlled in a Group IB-IIIA-VIA deposition technique. Solar cells fabricated on the absorbers produced, showed only very weak photo response and an efficiency of less than 1%.

As the above review demonstrates, there is a need for techniques to provide Group IB-IIIA-VIA and related compound films on large area substrates, with good compositional control and uniformity. There is also a need for such compound films with superior electronic properties, that would make them suitable for the fabrication of active electronic devices such as solar cells with conversion efficiencies of close to or above 10%.

SUMMARY OF THE INVENTION

In accordance with the invention, a method for forming a compound film includes the steps of preparing a source material, depositing the source material on a base and forming a preparatory film from the source material, heating the preparatory film in a suitable atmosphere to form a precursor film, and providing a suitable material to the precursor film to form the compound film. The source material includes oxide-containing particles including Group IB and IIIA elements. The precursor film includes non-oxide Group IB and IIIA elements. The compound film includes a Group IB-IIIA-VIA compound.

The providing step may include heating the precursor film in a suitable atmosphere. The oxides may constitute greater than about 95 molar percent of the Group IB elements and greater than about 95 molar percent of the Group IIIA elements in the source material. Similarly, non-oxides may constitute greater than about 95 molar percent of the Group IB elements and greater than about 95 molar percent of the Group IIIA elements in the precursor film. The molar ratio of Group IB to Group IIIA elements in the source material may be greater than about 0.6 and less than about 1.0, or substantially greater that 1.0, in which case this ratio in the compound film may be reduced to greater than about 0.6 and less than about 1.0. The source material may be prepared as an ink from particles in powder form. The oxide-containing particles may include a dopant, as may the compound film. A compound film including a Group IIB-IVA-VA compound may be substituted using appropriate substitutions in the method. The method, also, is applicable to fabrication of solar cells and other electronic devices.

The foregoing and additional features and advantages of this invention will become further apparent from the detailed description and accompanying drawing figures that follow. In the figures and written description, numerals indicate the various features of the invention, like numerals referring to like features, throughout for the drawing figures and the written description.

DETAILED DESCRIPTION OF THE INVENTION

Figure 1:
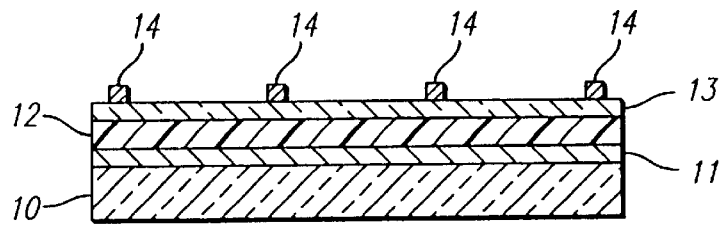
FIG. 1 is a cross-sectional view of a solar cell made in accordance of with the present invention.

The typical general structure of a conventional Group IB-IIIA-VIA compound solar cell, as well as one made in accordance with the present invention, is shown in FIG. 1. The device is fabricated on a substrate that includes a sub-layer 10, such as of a glass material. P-type absorber film 12 is deposited over a conductive layer 11, e.g. made of molybdenum (Mo), which acts as the back ohmic contact to the solar cell, and which is a coating for the sub-layer of the substrate. The sub-layer 10 and its coating 11 may together be regarded as the substrate.

An n-type transparent window layer 13 is formed on the p-type absorber film 12, through which radiation enters the device. The solar cell is completed by depositing metallic grid finger patterns 14 over the window layer 13, if needed. The most commonly used Group IB-IIIA-VIA p-type absorber films 12, can be represented by the general chemical formula of CuIn$_{1-x}$Ga$_x$Se$_{2(1-y)}$S$_{2y}$, where $0 \leq x \leq 1$ and $0 \leq y \leq 1$. This group of compounds is also represented by the general chemical formula of Cu(In,Ga)(Se,S)$_2$.

Constituent elements of the representative specific compounds mentioned in this document are grouped according to the notations of columns of the periodic table defined by Chemical Abstracts Service (CAS), as shown in the CRC Handbook of Chemistry & Physics, 72nd edition, 1991-1992, published by CRC Press, Inc., e.g., the inside cover table.

A variety of materials, deposited by a variety of methods, can be used to provide the components of the device depicted in FIG. 1. For example, the substrate sub-layer 10 can be rigid or flexible, conductive or insulating. Possible sub-layer 10 materials include, but are not limited to, sheets or flexible foils of insulating sub-layers such as glass, alumina, mica or polyimide materials, or conductive materials, such as molybdenum (Mo), tungsten (W), tantalum (Ta), titanium (Ti), aluminum (Al), nickel (Ni), graphite and stainless steel.

The conductive layer or coating 11 is made of a conductive material that provides good ohmic contact to the Group IB-IIIA-VIA semiconductor absorber film 12, like Mo which is the preferred material, W, Ta, Ti, gold (Au), and their nitrides, borides, carbides, or phosphides. The conductive layer 11, in fact, may consist of two or more layers of materials. The conductive layer 11 is not needed if the sub-layer 10 is a conductive material, that would provide good ohmic contact to the semiconductor absorber film 12.

The material of the Group IB-IIIA-VIA semiconductor absorber film 12, that can be deposited using the teachings of this invention, is selected from the group consisting of ternary or higher order selenides, sulfides and tellurides of copper (Cu), silver (Ag), aluminum (Al), gallium (Ga), indium (In), thallium (Tl) and their alloys. The preferred material for the layer of the absorber film 12 is CuIn$_{1-x}$Ga$_x$Se$_{2(1-y)}$S$_{2y}$, where $0 \leq x \leq 1$ and $0 \leq y \leq 1$. This layer may additionally contain dopants such as potassium (K), sodium (Na), lithium (Li), phosphorous (P), arsenic (As), antimony (Sb) and bismuth (Bi) to enhance its electronic properties.

The window layer 13 has one or more layers of transparent semiconductor materials commonly used in solar cells, like cadmium (Cd), zinc (Zn) and sulfur (S) or selenium (Se) compounds such as Cd(Zn)S and ZnSe, or transparent conductive oxides such as ZnO, Zn-stannate, indium tin oxide, and tin oxide. Various layers may also be paired, to optimize device performance. Possible structures of optimized window materials include, but are not limited to, Cd(Zn)S/TCO, ZnSe/TCO, In(Ga)-selenide/TCO, In(Ga)-sulfide/TCO, and In(Ga)-oxide/TCO where TCO represents one or more layers of Transparent Conductive Oxides such as ZnO, indium tin oxide and tin oxide. The window layer 13 materials can be deposited by various techniques well known in the art. As is conventionally understood, notations such as "Cd(Zn)S" and "In(Ga)" mean all compositions going from pure CdS to pure ZnS and all compositions going from pure In to pure Ga, respectively.

The finger pattern 14 may be deposited on the device structure to reduce the series resistance introduced by the window layer 13. In module structures employing narrow cells, there is no need for finger patterns 14. An anti-reflection coating (not shown) can also be deposited over the window layer 13 to further improve the efficiency of the finished solar cells.

The preferred electrical type of the Group IB-IIIA-VIA absorber film 12 of FIG. 1 is p-type, and the preferred type of the window layer 13 is n-type. However, an n-type absorber and a p-type window layer can also be utilized. The preferred device structure of FIG. 1 is commonly referred to as a "substrate-type" structure. A "superstrate-type" structure can also be constructed by depositing a window layer first on a transparent substrate such as of a glass material, then depositing the Group IB-IIIA-VIA compound absorber film, and finally forming a back ohmic contact to the device by a conductive layer. In this superstrate-type structure, solar energy or light enters the device from the transparent superstrate side.

Figure 2:
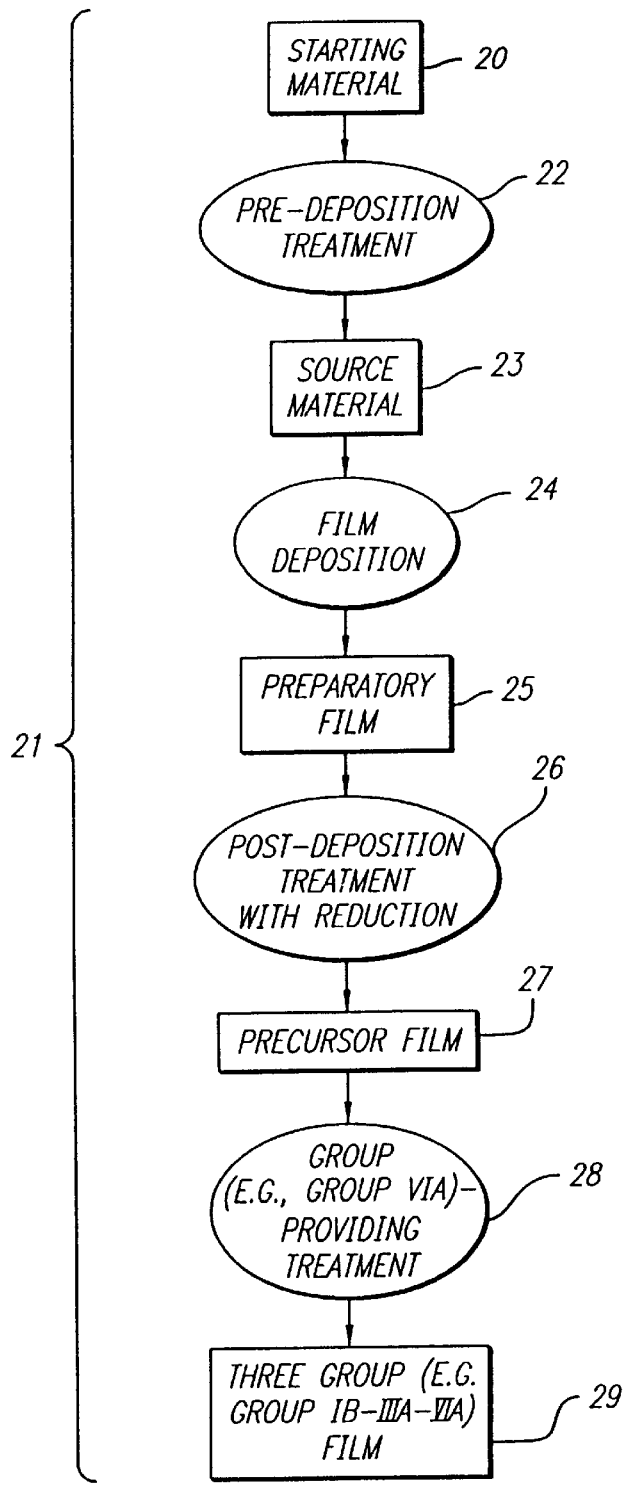
FIG. 2 is a flow chart showing the steps of a method that can be used to grow compound semiconductor thin films, including three groups of elements, in accordance with the invention.

FIG. 2 shows the general steps of a process 21 for deposition of a Group IB-IIIA-VIA compound film, where the desired I/III ratio is fixed in a source material 23 before film deposition, and this fixed composition is transferred first into a preparatory film 25 and then into a precursor film 27, used to form the Group IB-IIIA-VIA compound film 29. The starting material 20 is the initial material employed in a pre-deposition treatment step 22, which treats the starting material 20 in a way to render it suitable for deposition onto a selected substrate in the form of a film. The result of the pre-deposition treatment step 22 is the source material 23 which can be transferred onto the substrate in the form of the preparatory film 25, through the film deposition step 24. This film deposition, for example, may also include drying. A post-deposition treatment with reduction step 26 forms the precursor film 27. This treatment, for example, may also include the application of heat at an elevated temperature, to anneal the preparatory film 25, before the reduction aspect. The group-providing, here Group VIA-providing, treatment step 28 converts the precursor film 27 into the final Group IB-IIIA-VIA compound film 29.

Figure 3:
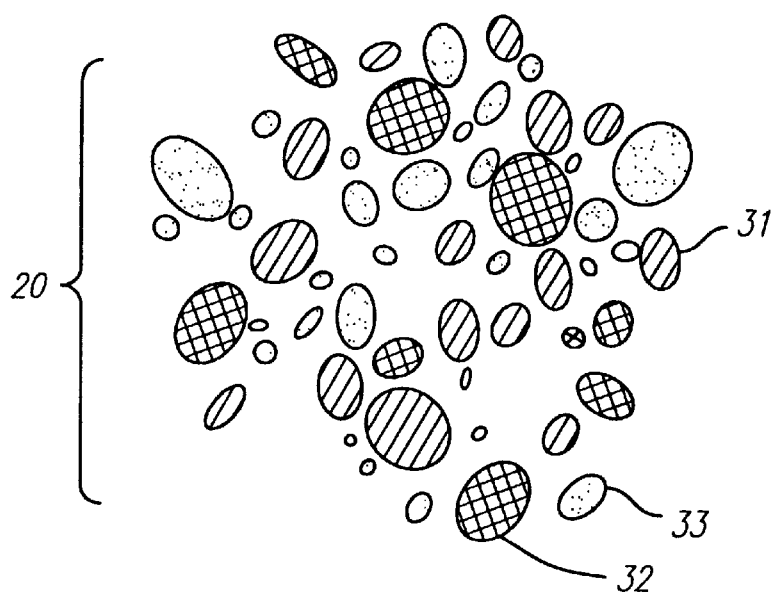
FIG. 3 is a schematic drawing showing the composition of the starting material, in accordance with the present invention.

With reference to FIG. 2, a preferred form of the starting material 20 of the present invention is powder. The composition of such a powder is schematically shown in FIG. 3. In FIG. 3 the starting material 20 includes Group IB-IIIA oxide containing particles 31, Group IB oxide particles 32, and Group IIIA oxide particles 33. The Group IB-IIIA oxide phases of particles 31 may include, but are not limited to, $Cu_2In_2O_5$, $CuGa_2O_4$ and $CuGaO_2$. The Group IB oxide phases of particles 32 may include but are not limited to, $Cu_2O$, $CuO$, and $Cu_4O_3$. The Group IIIA oxide phases of particles 33 may include, but are not limited to $In_2O_3$, $Ga_2O_3$, $GaInO_3$. The Group IB-IIIA oxide containing particles 31 may, in addition to the Group IB-IIIA oxide phases, contain Group IIIA or Group IB oxide phases also. It is significant, however, that the I/III ratio in the Group IB-IIIA oxide containing particles 31 be fixed and known beforehand and that the overall I/III ratio in the powder 20 be fixed and known.

With reference to FIG. 2, the reduction in the post-deposition treatment 26 involves chemical reduction of the oxides in the preparatory film 25. The result of the post-deposition treatment 26 is the formation of a precursor film 27 that is substantially made of Group IB-IIIA alloys and Group IB and/or Group IIIA elemental phases. The Group VIA-providing treatment step 28 incorporates the reaction of the precursor film 27 with one or more Group VIA elements to form the Group IB-IIIA-VIA compound film 29.

With reference to FIG. 3, the preferred Group IB element is Cu and the preferred Group IIIA elements are In and Ga. The oxide particles 31, 32, 33 may typically range in size (largest dimension across) from about 0.001 $\mu$m to 1000 $\mu$m, the preferred range being about 0.001–20 $\mu$m. The powders can be obtained by various methods known to those skilled in the art of materials synthesis. These techniques include but are not limited to mechanical grinding of a bulk material, atomization or spinning of a melt, inert or reactive gas condensation, arc plasma techniques, electrolytic techniques, precipitation methods and spray pyrolysis. Chemical techniques used for nano-particle generation are also applicable to the preparation of the powders used in the present invention.

Figure 4A:
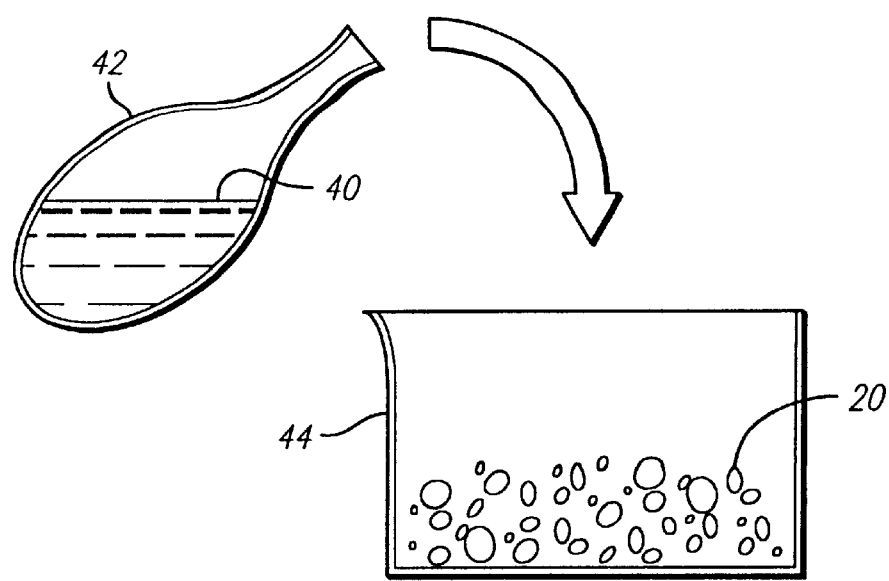
FIG. 4A diagrammatically illustrates starting material powder being mixed with a liquid as a step to form an ink.

FIGS. 4A through 4G diagrammatically illustrate a process in accordance with the invention. FIG. 4A diagrammatically illustrates the starting material powder 20 being mixed with a liquid as a step to form an ink. This is diagrammatically represented by pouring the liquid 40 from a flask 42 into a beaker 44 containing the powder 20. This is part of the pre-deposition treatment, represented in FIG. 2 at 22.

Figure 4B:
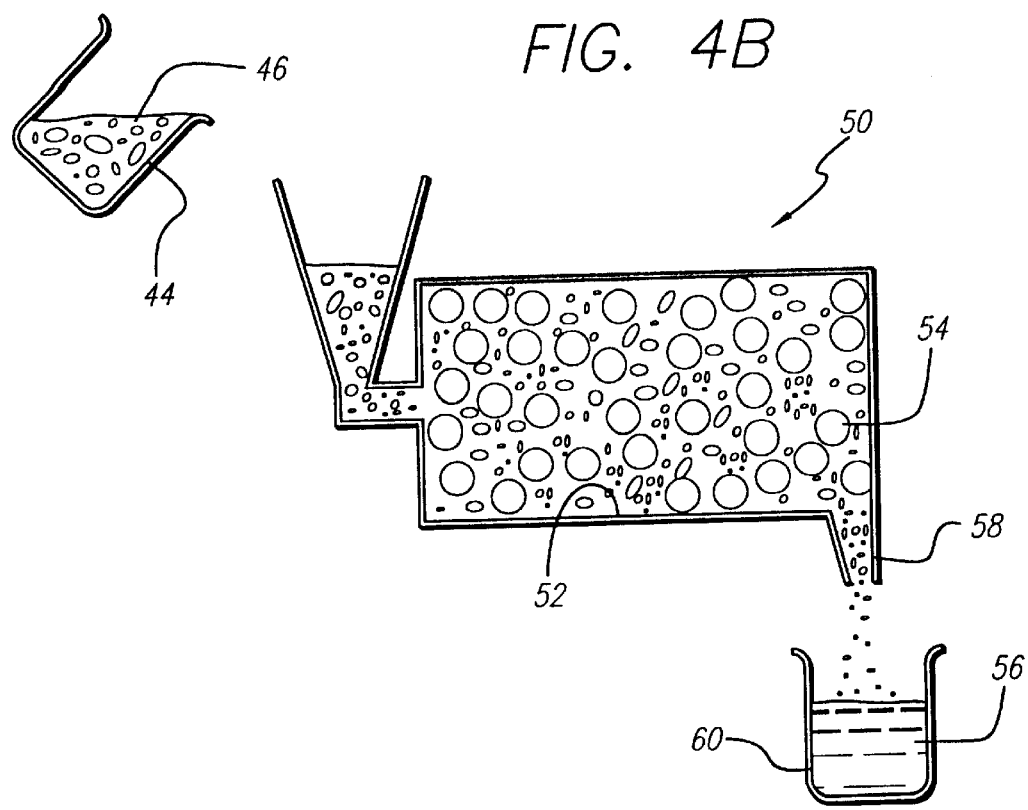
FIG. 4B diagrammatically illustrates the powder-containing liquid being subjected to ball-milling to form an ink.

FIG. 4B diagrammatically illustrates the powder containing liquid being subjected to milling for ink formation. This is also a part of the pre-deposition treatment, represented in FIG. 2 at 22, to decrease the particle size of the starting material and to form a dispersion. It is diagrammatically represented as accomplished by flowing the powder containing liquid 46 through a mill 50. The mill 50 includes a compartment 52 within which balls 54 of a hard material, such as a ceramic material, are rotated or shaken at a high rate by rotating or shaking their container. The powder containing liquid 46 passes through the compartment with the rotating or shaking balls, and the powder is ground and dispersed by the action of the balls. The ink 56 thus formed is dispensed from the output port 58 of the mill into a container 60. This ink 56 is the source material indicated at 23 in FIG. 2.

Figure 4C:
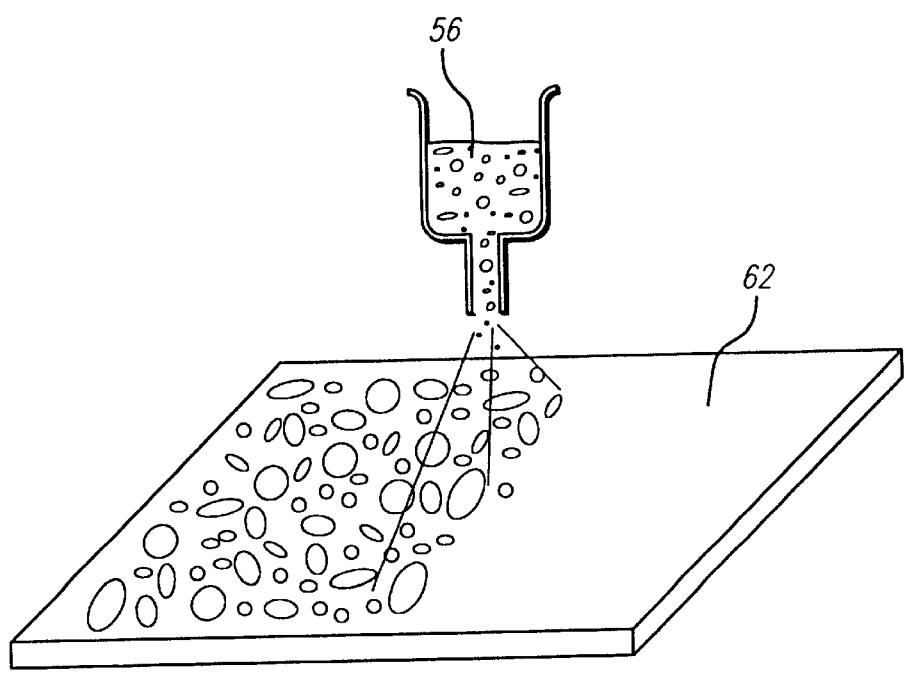
FIG. 4C diagrammatically illustrates the milled ink being deposited on a large substrate.
Figure 4D:
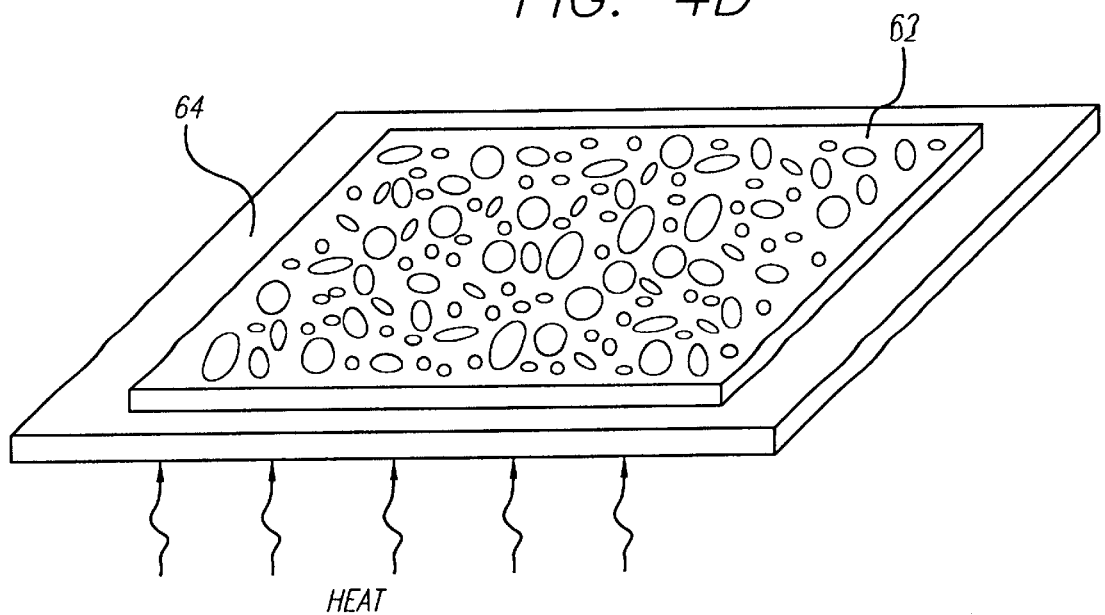
FIG. 4D diagrammatically illustrates the substrate with the deposited ink being dried through the application of heat.

FIG. 4C diagrammatically illustrates the ink 56 being deposited on a substrate 62 in the form of a film. This, of course, illustrates the film deposition, represented in FIG. 2 at 24, and results in the preparatory film, represented at 25 in FIG. 2, on the substrate. As part of the film deposition, there may be drying through the application of heat. This is illustrated in FIG. 4D with the preparatory film on the substrate on a heated plate 64.

Figure 4E:
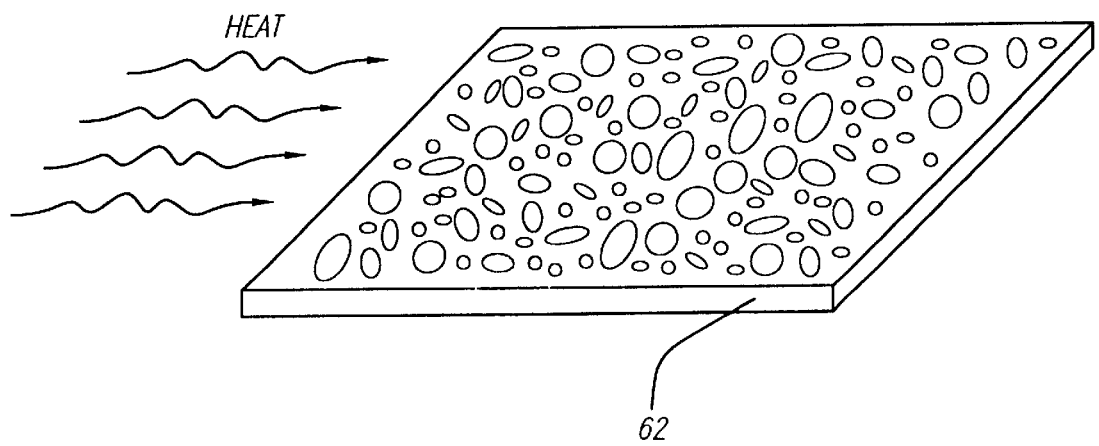
FIG. 4E diagrammatically illustrates the application of heat, to anneal the dried deposited material on the substrate.

FIG. 4E, as part of the post-deposition treatment with reduction step indicated at 26, diagrammatically illustrates the dried preparatory film 25 on the substrate 62 being subjected to an elevated temperature in order to anneal the film.

Figure 4F:
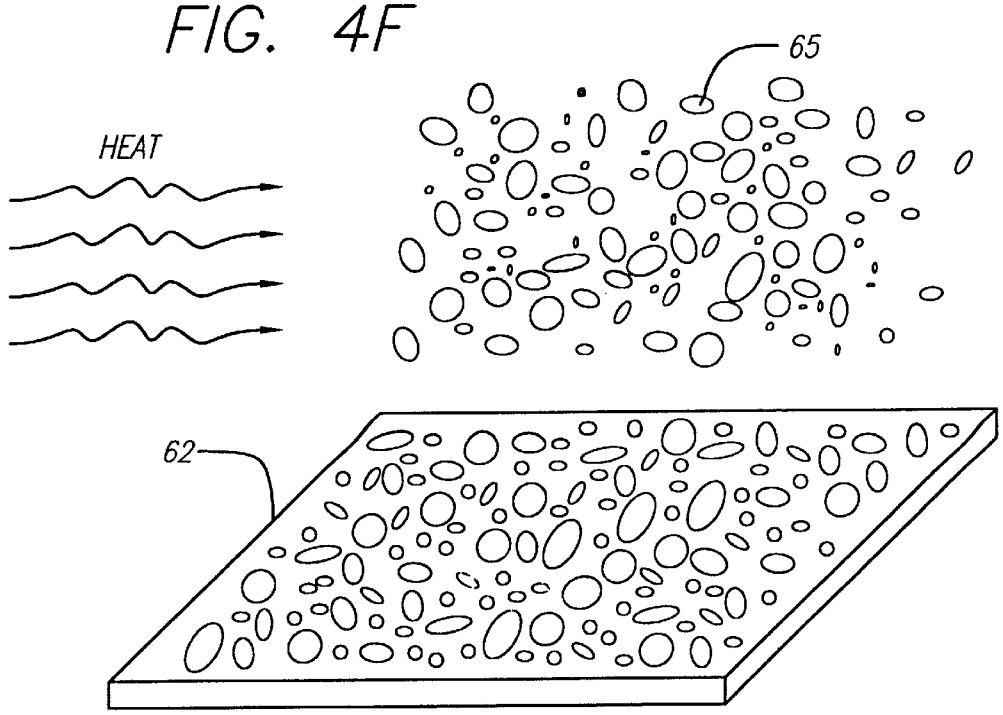
FIG. 4F diagrammatically illustrates the annealed deposited material on the substrate being subjected to a reducing atmosphere and heat.

FIG. 4F diagrammatically illustrates the substrate 62 with the annealed preparatory film on it, being subjected to an oxide reducing atmosphere 65 and heat to form the precursor film containing Group IB-IIIA alloys and Group IB and/or Group IIIA elemental phases. This is incorporated in the post-deposition treatment with reduction step indicated at 26 in FIG. 2 and results in the precursor film indicated at 27 in the same figure.

Figure 4G:
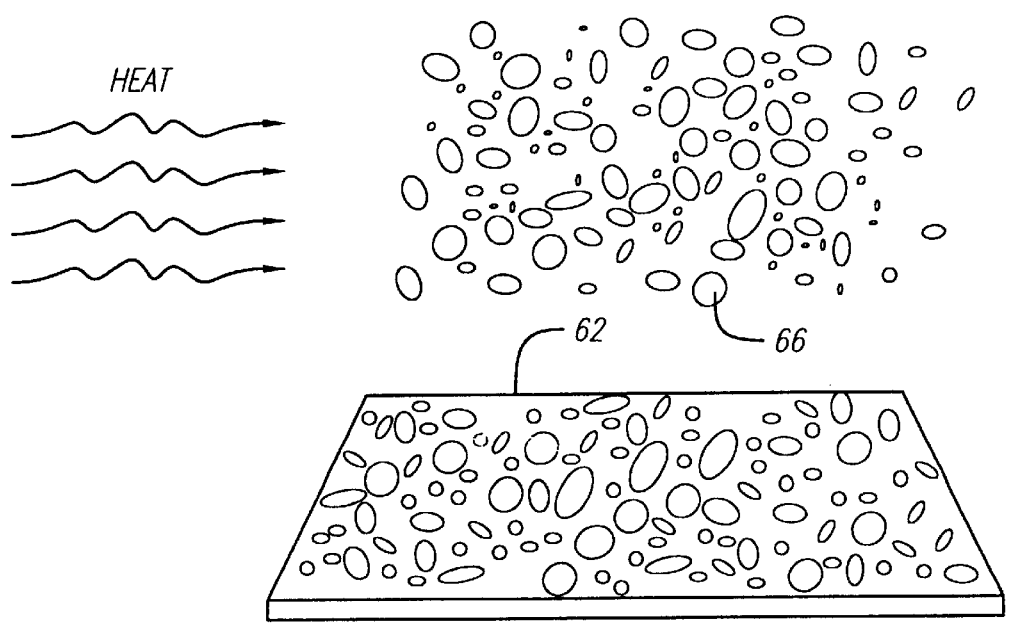
FIG. 4G diagrammatically illustrates the substrate and deposited material, after the reducing atmosphere and heat treatment, being subjected to an atmosphere containing an element or elements from a third Group and heated to form a three-Group compound film on the substrate.

FIG. 4G diagrammatically illustrates the substrate 62 with the precursor film on it being subjected to an atmosphere 66 containing vapors that include Group VIA elements accompanied by the application of heat, corresponding to the Group VIA-providing treatment step indicated at 28 in FIG. 2, to form the Group IB-IIIA-VIA compound film on the substrate, such compound film represented at 29 in FIG. 2.

Referring back to FIGS. 2 and 4, the pre-deposition treatment 22, as described, involves milling of the starting material 20. Milling can be carried out in liquid media such as water, alcohols and other organic liquids, or it can be carried out dry. The purpose of the milling step is to reduce the size of the particles constituting the starting material 20. This is important for micro-scale uniformity of the films to be grown. The particle size should be smaller than the thickness of the film to be grown. It should preferably be smaller than 2.0 $\mu$m. This may be determined by standard particle size analysis techniques which are used to assure that substantially all of the particles in a group are less than or equal to a certain size, such as light scattering analysis. It is preferable that the technique shows less than 1% of the particles exceed this size, although less than 5% may be acceptable. This size may typically be considered as the longest straight line that could be drawn between two points on the surface of the particle. Source material 23 that is obtained as a result of the pre-deposition treatment 22 may be in the form of a paste, an ink or a dry powder.

If the particle size of the starting material powder 20 is already small, then the milling process may not be needed. It is also possible to mill the various components of the starting material 20 separately, and then mix the milled components in forming the source material 23. For example, for a starting material having only Group I-III oxide containing particles 31 and the Group IIIA oxide particles 33, a powder of each may be prepared and milled to form separate inks. These inks may then be mixed to form the source material 23 of FIG. 2.

Source material 23 may additionally contain electrical dopants. These dopants may originate from the starting material, for example, may be present as one or more separate type of particle components of a mix similar to that in FIG. 3, or mixed in as additional constituents of other particle components. Thus, of course, as one method, they can be included in the form of additional powders of oxides or other compounds of the dopant elements or they can even be dissolved in the solvent of the ink. Such dopants may also be added for inclusion in the Group IB-IIIA-VIA compound film at other points of the process. For example, dopants can be deposited over the preparatory film 25 or over the precursor film 27. Group IA and/or Group VA elements typically may serve as such dopants for Group IB-IIIA-VIA compound films.

Referring to FIG. 2, the preparatory film 25 is obtained by depositing the source material 23 onto the substrate, which may be a two-layer substrate consisting of a sub-layer and a coating layer, in the form of a film through the film deposition step 24. Various techniques can be used for the film deposition step 24. For source materials 23 that are in the form of pastes, screen printing techniques can be employed. If the source material 23 is in the form of an ink or paint, many wet deposition techniques known to those skilled in the art can be used, like painting by spray, brush, roller or pad, gravure printing, stamp printing, doctor blading or cup coating, ink writing and curtain coating. If the source material 23 is in the form of dry powder it can be coated on the substrate using dry powder coating methods such as spraying, including electrostatic spraying. The preparatory film 25 should have a thickness of greater than or equal to 0.5 $\mu$m and less than or equal to 20 $\mu$m, the preferred thickness range being greater than or equal to 1.0 $\mu$m and less than or equal to 6 $\mu$m, and it may be subjected to heat treatment to dry it, fuse it, or otherwise prepare it for the chemical reduction in the post-deposition with reduction treatment step 26. For example, as indicated, drying through heat is illustrated in FIG. 4D as part of the film deposition step 24 in FIG. 2.

One significant feature is that the I/III ratio in the source material 23 is fixed and relatively uniform. When this source material is used to deposit the preparatory film 25 onto a substrate, the fixed I/III ratio essentially is directly transferred into the preparatory film 25 in a relatively uniform manner irrespective of the size of the substrate or the thickness uniformity of the preparatory film 25 and then the fixed ratio essentially is kept in the precursor film 27 as well as the Group IB-IIIA-VIA compound film 29.

In order to promote this result, maximizing, in the starting material 20, the presence of materials that incorporate the oxides of Group IB and IIIA elements is advantageous. With a goal of 100%, such oxides preferably should be at least 95% in terms of molar percent, of each of the Group IB and Group IIIA content in the starting material. On the other hand, also related to promoting this result, is the minimization in the resulting precursor film 27 of any oxides of the Group IB and IIIA elements. The precursor film 27 should incorporate Group IB-IIIA alloys and Group IIIA and/or Group IB elemental phases. With a goal of 100%, such alloy or elemental phases preferably should be at least 99%, and certainly at least 95%, in terms of molar percent, of each of the Group IB and Group IIIA content in the precursor film.

Still referring to FIG. 2, after its deposition, the preparatory film 25 is subjected to the chemical reduction, incorporated in the post-deposition treatment 26 to form the precursor film 27. The post-deposition treatment, first, includes a heat treatment which may be in the form of furnace annealing at atmospheric pressure, annealing at low or high pressures, annealing in a plasma, rapid thermal annealing, microwave or induction heating or laser annealing. If the post-deposition treatment 26 includes only one heat treatment step, it is important that its atmosphere contain, or if the post-deposition treatment 26 includes more than one heat treatment step, it is important that the atmosphere of the last heat treatment contain, reducing agents that can remove oxygen from the oxide particles that are present in the preparatory film 25. Such reducing agents include, but are not limited to, hydrogen ($H_2$), carbon monoxide (CO) and methane ($CH_4$). This atmosphere may additionally contain inert gases such as nitrogen ($N_2$), argon (Ar) and helium (He), but it should exclude any chemical species that would prevent reduction of the oxides in the preparatory film 25 and prevent the formation of a precursor film 27 that substantially consists of alloy (non-oxides) or elemental phases of Group IB and Group IIIA materials. For example, this atmosphere should not contain any of the Group VIA elements such as sulfur and selenium. Presence of these elements in the atmosphere would result in the formation of selenide and sulfide phases that do not have the electrical and structural properties that are suitable for device fabrication.

The precursor film 27 resulting from the post deposition treatment 26 substantially consists of metallic phases of Group IB and Group IIIA elements in alloy and elemental forms. The precursor film 27 may contain Group IB elements, Group IIIA elements and the alloys of Group IB and Group IIIA elements. These alloy phases include, but are not limited to, CuIn, $CuIn_2$, $Cu_{16}In_9$, $Cu_9In_4$, $Cu_7In_3$, $Cu_{11}In_9$, $CuGa_2$, $Cu_9Ga_2$ and alloys thereof.

The Group VIA-providing treatment step 28 involves the reaction of the precursor film 27 with Group VI elements such as S, Se or Te under applied heat. The Group VIA elements for reaction can be supplied through a gas phase or they can be deposited on the precursor film 27 and reacted with it under heat. In the case of selenide growth the annealing atmosphere may contain $H_2Se$, $(CH_3)_2Se$, $(C_2H_5)_2Se$ or Se vapor. In the case of sulfide growth $H_2S$, $CS_2$ or S vapors can be used. For sulfo-selenide layers a mixture of S and Se containing species in the annealing atmosphere can be employed or one type of the Group VIA element such as Se may be deposited on the precursor film 27 and the other one such as S can be supplied from the annealing atmosphere during the reaction step 28. The temperature of annealing in the Group VIA-providing treatment step 28 can be in the range of 350° C. to 700° C., with the preferred range being 400° C. to 600° C. The duration of annealing depends on the temperature of annealing and it may vary from about 5 minutes to about 3 hours, with about 15 minutes to about 1 hour preferred if furnace annealing is employed. Shorter times are possible if rapid thermal annealing is utilized.

In one preferred embodiment of the present invention the I/III molar ratio of the source material 23 is greater than or equal to 0.8 and less than or equal to 1.0, and this ratio is substantially carried to the precursor film 27 in a relatively uniform manner. Referring to FIG. 2, in this case, the I/III molar ratio of the Group IB-IIIA-VIA compound film 29 is very close to the I/III ratio of the source material 23. Alternatively, a source material 23 with a I/III ratio of higher than 1.0 and up to 1.2 can be prepared, and a precursor film 27 with substantially the same ratio can be obtained through the appropriate steps labeled 24, 25 and 26 in FIG. 2. Then, during the Group VIA-providing treatment step 28, additional Group IIIA can be added to the compound film 29, bringing its overall I/III ratio to the desired range less than or equal to 1.0 (while greater than or equal to 0.8).

EXAMPLE 1. (Use of $CuO+In_2O_3$ ink to grow Cu—In alloy layer.)

A Cu-hydroxide+In-hydroxide mixture was precipitated from an aqueous solution of Cu and In sulphates—$CuSO_4$ and $In_2(SO_4)_3$. The precipitate thus obtained was washed, filtered and dried at 130° C. into an initial powder. The Cu/In molar ratio of this initial powder was 0.9. The initial powder was then placed into an alumina crucible and heat treated in air at 550° C in a furnace for 20 hours. This heat treating step was repeated three times, at the end of each cycle cooling the powder down and mixing it well before heating it up again. The resulting oxide starting material 20 was dark brown in color and it consisted essentially of intimately mixed CuO+ $In_2O_3$. A water based ink was prepared using this oxide powder. The ink making process consisted of adding water and a dispersing agent (sold under the name Tamol by Rohm and Haas) to the oxide powder, placing the mixture and zirconium oxide balls into an alumina jar of a ball-mill, and milling the mixture for 42 hours. The amount of oxide powder in the mixture, without the Tamol, corresponded to 30% (by weight), with 70% water. The amount of Tamol was 1% of the oxide powder. The ink was coated on a Mo/glass substrate using the cup-coating (doctor blading) technique. The oxide preparatory film 25 thus obtained was dried on a hot plate at around 60° C. The coating cup used had an edge with an opening of 0.5 mil (12.7 $\mu$m). The two-layer substrate was made of a glass sub-layer and Mo coating (such as shown at 10 and 11 in FIG. 3). The glass was a conventional piece of off-the shelf soda lime glass. Such glass typically contains about 15–17 percent sodium oxide (by weight). The resulting film, after drying, was about 6 $\mu$m thick.

Figure 5A:
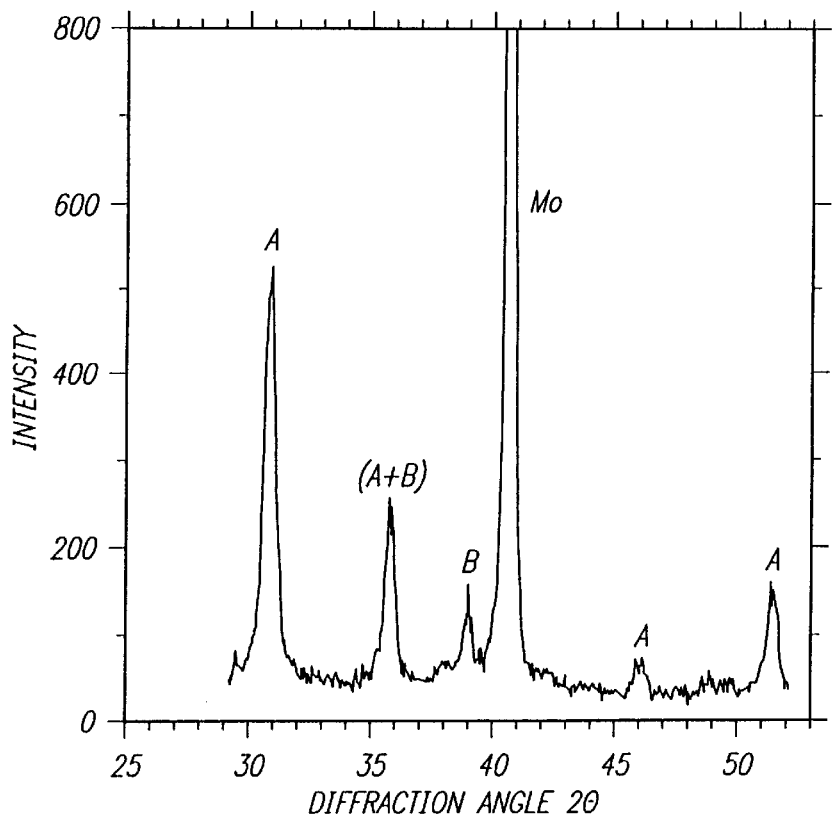
FIGS. 5A, 5B and 5C illustrate x-ray diffraction data obtained at several stages that apply to growth of a CuInSe$_2$ compound film in accordance with the invention, with some variation in the conditions.
Figure 5B:
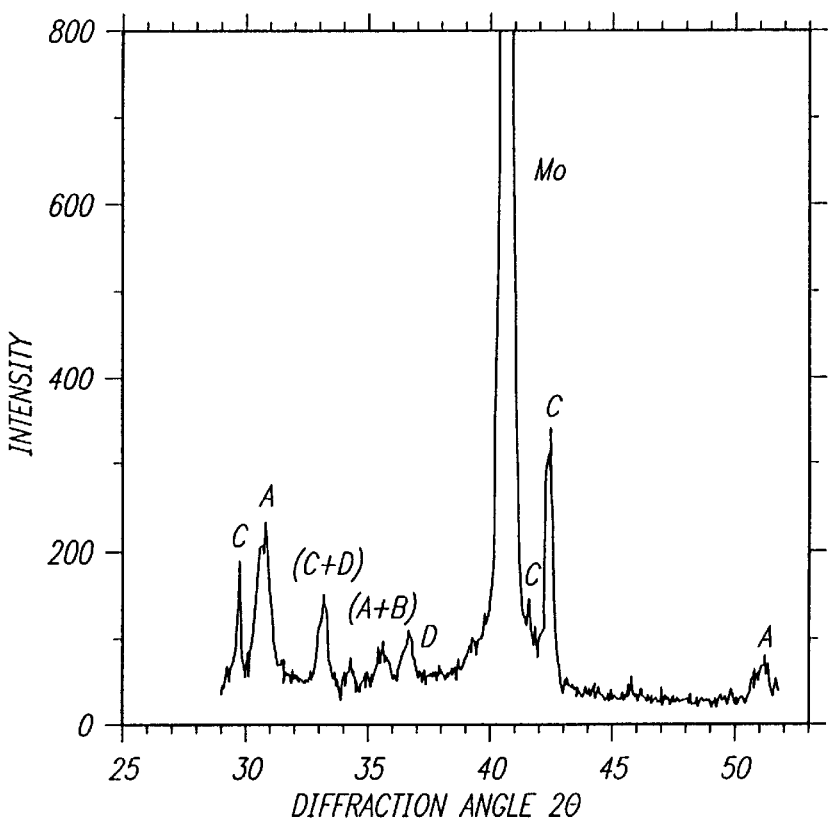

After drying, the glass/Mo/oxide structure was analyzed by X-ray diffraction. The relevant part of this data is shown in FIG. 5A. The peaks labeled A and B are associated with $In_2O_3$ and CuO phases, respectively. The Mo peak is due to the Mo coating on the glass substrate. This data shows that, in fact, the chemical composition of the ink was substantially $In_2O_3$ and CuO The glass/Mo/oxide structure was then put into a tube furnace and annealed at 385° C. for 45 minutes under flowing 20% $H_2$ (by volume)+Ar gas. X-ray diffraction data for the resulting precursor film 27 is shown in FIG. 5B; and it shows the formation of $Cu_{11}In_9$ (peaks labeled C) and In (peaks labeled D) phases. There is, however, still an appreciable amount of $In_2O_3$ phase as indicated by the presence of peaks labeled A.

Figure 5C:
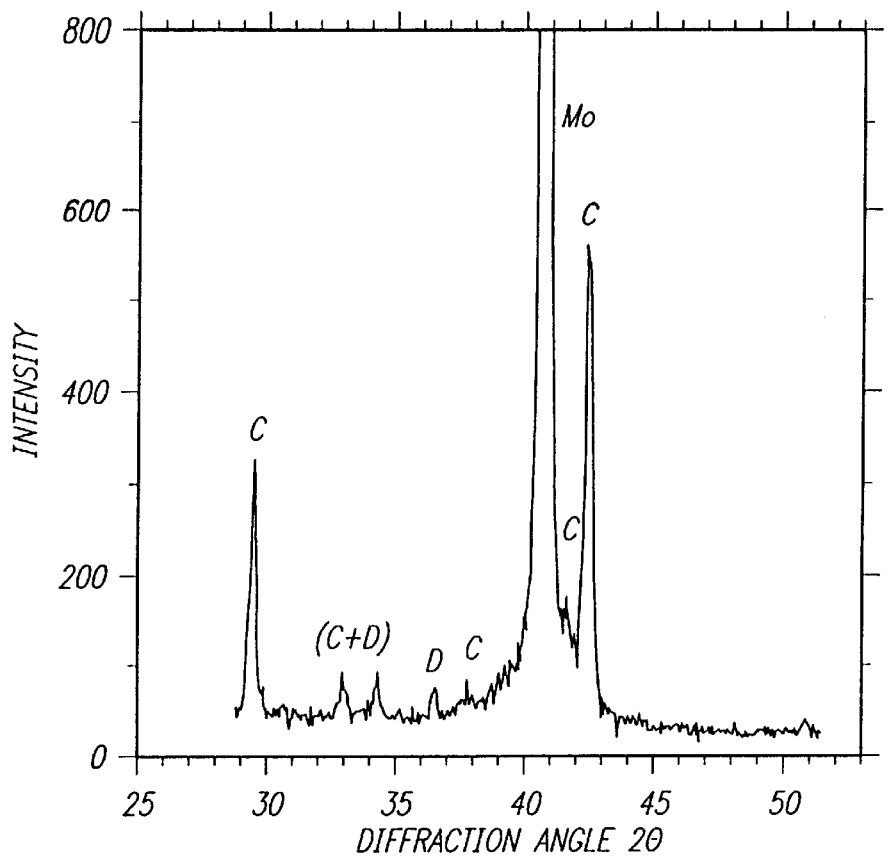

Another piece of the same glass/Mo/oxide structure was annealed in the $H_2$ containing atmosphere, however, this time at 465° C. for 20 minutes. X-ray diffraction data for this resulting precursor film 27 is shown in FIG. 5C. All the prominent peaks, labeled C and D, are associated with Cu—In alloy phases and In phases, respectively. No oxide peaks are visible. This is a demonstration of the ability of this invention to yield layers containing substantially only Group IB-IIIA alloys and Group IB and/or IIIA elemental phases through a low cost process at temperatures that are compatible with low cost soda-lime glass substrates.

EXAMPLE 2. (Use of $CuO+In_2O_3$ ink to demonstrate active devices.)

A Cu-hydroxide+In-hydroxide mixture with a fixed Cu/In ratio of 0.9 was obtained as in Example 1, except using nitrates rather than sulfates—$Cu(NO_3)_2$ and $In(NO_3)_3$. A portion of this initial powder was then heat treated in air at 550° C. as in Example 1 and an ink was formed using the same procedures described in Example 1. The dark brown ink was coated on the same form of Mo/glass substrate (soda lime glass) as in Example 1 by the cup-coating technique using a cup having an edge with an opening of 1.0 mil (25.4

$\mu$m). The oxide preparatory film 25 thus obtained was first dried on a hot plate at around 60° C., and then annealed in air at 365° C. for 60 minutes. This film was about 5 $\mu$m thick. Good quality films were produced without this annealing. However, the annealing in air improved the nucleation characteristics of the films, possibly due to removal of the organics of the dispersing agent.

After drying and annealing, the glass/Mo/oxide structure was put into a tube furnace and oxide reduction was carried out in a flowing 50% $H_2$+Ar gas mixture. The temperature of the furnace was raised to 495° C. in 25 minutes and was kept there for an additional 60 minutes. The resulting precursor film 27 of Cu—In alloy (and possibly In elemental phase) appeared metallic and it was placed in a selenization chamber. The selenization process was carried out in a 5% $H_2Se+N_2$ atmosphere at a temperature of 425° C. for one hour.

Figure 6:
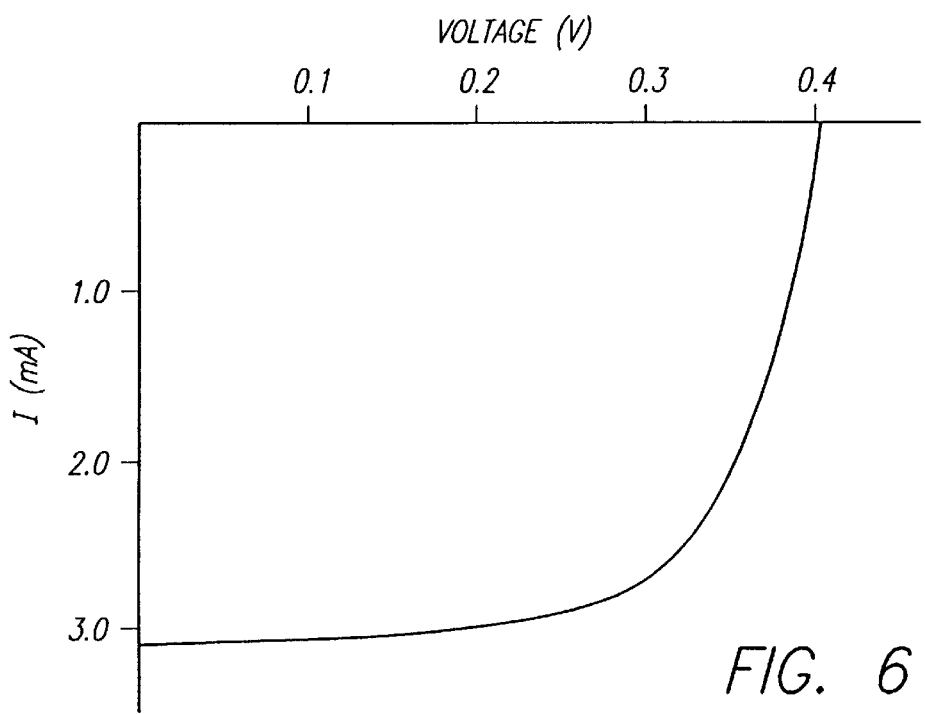
FIG. 6 illustrates an illuminated I–V characteristic of a solar cell, fabricated with a CuInSe$_2$ film grown in accordance with the present invention.

To evaluate the electronic quality of the $CuInSe_2$ compound film 29 thus obtained, $CuInSe_2$/CdZnS solar cell devices were fabricated using this layer. Standard procedures known in the field were used for device fabrication steps. A thin layer of CdZnS was coated by commonly used chemical bath deposition technique. The deposition bath consisted of 5 ml of 0.5 molar zinc acetate, 10 ml of 1.0 molar cadmium acetate, 7 ml of triethanolamine, 4.5 ml of ammonium hydroxide and 55 ml of distilled water. The solution was heated to 55° C. and then the sample was placed in the beaker containing the solution. Twelve ml of 1.0 molar thiourea was then added into the beaker initiating the CdZnS deposition which lasted 10 minutes. Since the $CuInSe_2$ film on the substrate was dipped in the bath, this deposition resulted in an extra layer of CdZnS deposited at the back of the substrate, which was removed using a cotton swab dipped in HCl. The CdS deposition was followed by the deposition of a transparent ZnO layer by the commonly used metal organic chemical vapor deposition (MOCVD) technique, employing diethyl zinc as the zinc source and water vapor as the oxygen source. The sheet resistance of the ZnO layer was about 10 ohms per square. Solar cells of 0.09 $cm^2$ were isolated and characterized. FIG. 6 shows the current versus potential (I–V) characteristics of one typical device made by this method with a conversion efficiency of 9.3%. This result demonstrates that the method has the capacity to yield material with electronic properties suitable for the fabrication of active electronic devices such as solar cells.

EXAMPLE 3. (Use of $Cu_2In_2O_5+In_2O_3$ ink to demonstrate active devices.)

A portion of the initial powder obtained in Example 2 was heat treated in air as in Example 2, however, this time the annealing temperature was raised from 550° C. to 850° C. The resulting powder was green in color and X-ray diffraction data showed that CuO and $In_2O_3$ powders reacted during this high temperature heat treatment and formed $Cu_2In_2O_5$ compound. Since the Cu/In ratio was 0.9, X-ray diffraction data also indicated the presence of an $In_2O_3$ phase in the powder. The green initial powder was used to prepare an ink using the same procedures described in Example 1. The ink was coated on the same form of Mo/glass substrate (soda lime glass) as in Example 1 by the cup-coating technique using a cup having an edge with an opening of 1.0 mil. The green colored oxide preparatory film 25 thus obtained was first dried on a hot plate at around 60° C., and then annealed in air at 365° C. for 60 minutes. The resulting film had a thickness of about 3 $\mu$m.

After drying and annealing, the glass/Mo/oxide structure was put into a tube furnace and oxide reduction was carried out in a flowing 50% $H_2$+Ar gas mixture. The temperature of the furnace was raised to 495° C. in 25 minutes and was kept there for an additional 60 minutes. The resulting precursor film of Cu—In alloy (and possibly In elemental phase) appeared metallic and it was placed in a selenization chamber. The selenization process was carried out in a 5% $H_2Se+N_2$ atmosphere at a temperature of 425° C. for one hour.

Figure 7A:
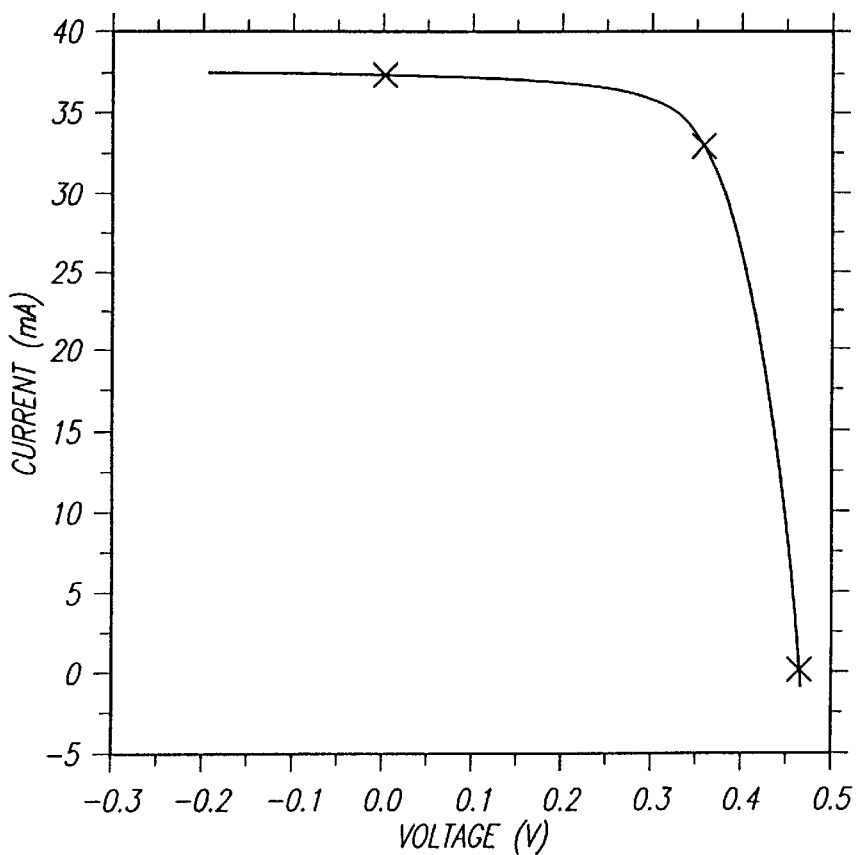
FIG. 7A illustrates an illuminated I–V characteristic of a solar cell, fabricated with a CuInSe$_2$ film, in accordance with another embodiment of the present invention.
Figure 7B:
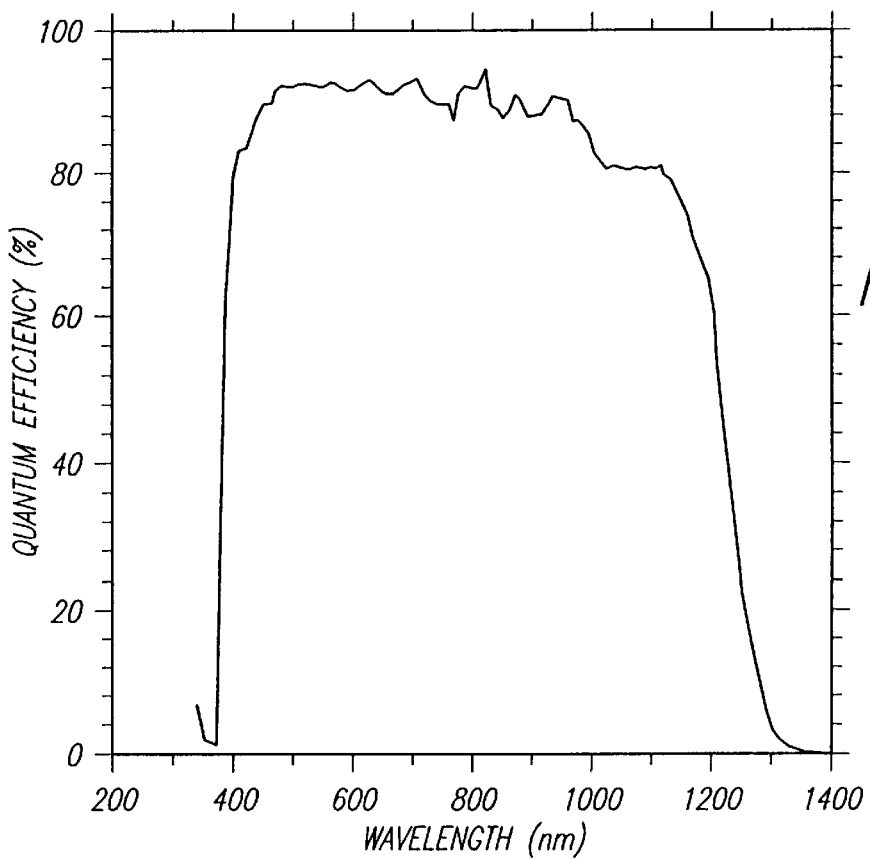
FIG. 7B illustrates the spectral response of this solar cell.

To evaluate the electronic quality of the $CuInSe_2$ compound film 29 thus obtained, $CuInSe_2$/CdZnS solar cell devices were fabricated using this layer. The steps of cell fabrication were the same as in Example 2. However, devices were larger in this case with an area of 1 $cm^2$. The I–V characteristics of one typical device made by this method with an 11.7% conversion efficiency is shown in FIG. 7A. The spectral response of the same device is shown in FIG. 7B. The high efficiency of this device as well as the relatively flat nature of its spectral response demonstrate the ability of the present method to yield high quality Group IB-IIIA-VIA absorber films.

EXAMPLE 4. (Demonstration of over 12% efficient solar cell devices.)

A Cu-hydroxide+In-hydroxide mixture was precipitated from an aqueous solution of Cu and In nitrates as in Example 2. The precipitate thus obtained was washed, filtered and dried at 130° C. into an initial powder. The Cu/In molar ratio of this initial powder was 0.9. The initial powder was then placed into an alumina crucible and heat treated in air at 550° C. in a furnace for 20 hours. This heat treating step was repeated three times, at the end of each cycle cooling the powder down and mixing it well before heating it up again. The resulting oxide starting material 20 was dark brown in color and it consisted essentially of intimately mixed CuO+ $In_2O_3$. A water based ink was prepared using this oxide powder. The ink making process was the same as in Example 1, except the dispersing agent was Tamol and sucrose, with their respective percentages (by weight) corresponding to 0.5% and 2% of the oxide powder, and with the oxide powder, without the dispersing agents, corresponding to 50% (by weight) of the water. The ink was coated on the same form of Mo/glass substrate (soda lime glass) as in Example 1 by the cup-coating technique using a cup having an edge with an opening of 0.5 mil (12.7 $\mu$m). The oxide preparatory film 25 thus obtained was first dried on a hot plate at around 60° C., and then annealed in air at 365° C. for 45 minutes. The resulting film had a thickness of about 4 $\mu$m.

After drying and annealing, the glass/Mo/oxide structure was put into a tube furnace and oxide reduction was carried out in a flowing 50% $H_2$+Ar gas mixture. The temperature of the furnace was raised to 495° C. in 60 minutes and was kept there for an additional 60 minutes. The resulting film of Cu—In alloy (and possibly In elemental phase) was placed in a selenization chamber. The selenization process was carried out in a 5% $H_2Se+N_2$ atmosphere at a temperature of 425° C. for one hour.

Figure 8:
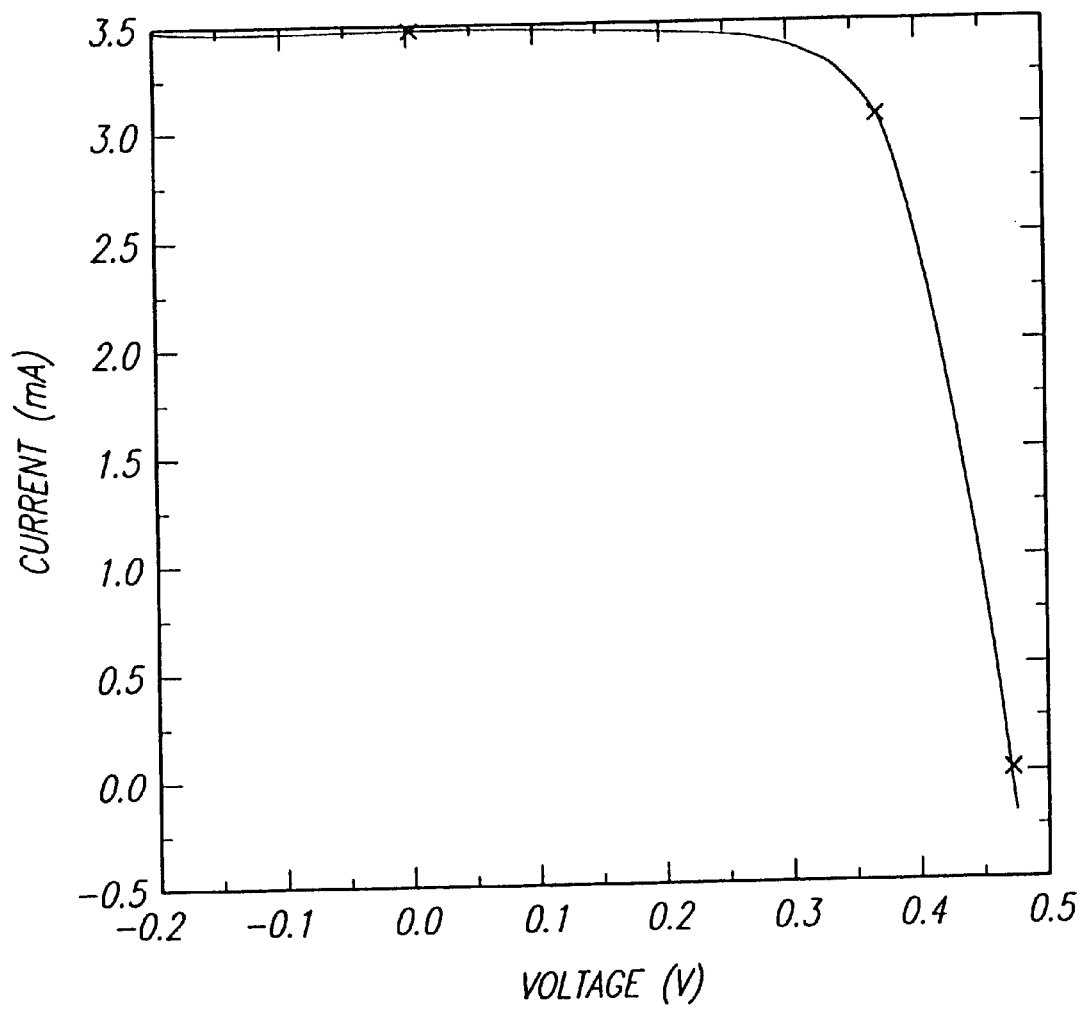
FIG. 8 illustrates the I–V characteristics of a solar cell fabricated with a CuInSe$_2$ film, in accordance with yet another embodiment of the present invention.

Solar cell devices were fabricated using the resulting $CuInSe_2$ compound layer. The steps of fabrication were the same as in Example 2. The I–V characteristics of one typical 0.09 $cm^2$ area device is shown in FIG. 8. The conversion efficiency of this device based on its total area is 12.4%. The active area efficiency is 13.3%, reflecting one of the most efficient Group IB-IIIA-VIA devices ever processed by a non-vacuum technique.

In each of the examples above, soda-lime glass containing Na was used. For films deposited on such glass, Na acts as a naturally-provided dopant for $CuInSe_2$, and as a result, assuming doping is desired, no additional doping is needed. The idea of doping assumes the presence of only a small percentage of dopant in the doped material, typically each dopant added being less than about 1 molar % of the atoms for which they may be substitutes in a material or formulation. In reality, only a small fraction of this 1 molar % usually becomes electronically active as a dopant in the material—typically less than about 1% of this 1%.

In the above examples, the doping from the substrate would be expected to contribute significantly to the efficiency provided by the compound films and the devices using them, with expected results significantly less positive without such doping. Therefore, in the absence of doping from the substrate, the incorporation of doping through other means, such as direct inclusion in the formulation of one or more materials, would be an expected feature of the specific process employed.

The basic method described certainly would be expected to be practical and provide significant positive results with a molar percent ratio of the Group IB element or elements to the Group IIIB element or elements in the compound film of greater than or equal to 0.6 and less than or equal to 1.0. As this ratio increases, the results should correspondingly improve, with greater than or equal to 0.80 and less than or equal to 1.0 typically more desirable. The use of doping, to some extent, can compensate for a lower-end ratio. Thus a I/III ratio, for example of 0.6 with doping, would be expected to provide results comparable to a significantly higher ratio with no doping. Also, as indicated already, a starting or intermediate ratio of greater than 1.0, but reduced to less than 1.0 by the end of, e.g., the Group VIA-providing step 28 may be provided, with a starting ratio of up to 1.2 expected to be practical and provide significant positive results.

The methods described have a range of applicability, e.g., from solar cells for large-scale power generation, to components for miniature devices such as medical sensors. Manufacturing large devices, at least one square foot and preferably four to eight square feet, would, based on the results, yield efficiencies as high as about 12% and at least 10%. Ultimately, efficiencies of 15% in large modules would be unsurprising.

For purposes of simplicity, the description has primarily focused on $CuInSe_2$-based structures and compound films of the Group IB-IIIA-VIA type. However, it should be understood that compound films of the Group IIB-IVA-VA-type may be substituted. The preferred elements from the applicable groups are Cu from Group IB, Ga and In from Group IIIA, S, Se and Te from Group VIA, Zn and Cd from Group IIB, silicon (Si), germanium (Ge) and tin (Sn) from Group IVA and phosphorous (P), Arsenic (As) and antimony (Sb) from Group VA. Typical exemplary oxides, for the preferred elements for the Group IIB-IVA-VA compound films, would be CdO, ZnO, $GeO_2$, $SnO_x$, and their compounds or solid solutions (where 0<X≦2). And the typical exemplary reducing agents would be $H_2$, CO, $CH_4$, and C. Group VA element would typically be introduced through a gas phase using a P-containing gas such as phosphine. The dopants preferred for the Group IB-IIIA-VIA materials are from Group IA, such as Li, Na, K and Ce, and from Group VA, such as P, As, Sb and Bi. The dopant should be less than or equal to about 1 molar % of the material for which it substitutes as such a dopant. As for the Group IIB-IVA-VA compound films, the preferred dopants for them are elements from Groups IA, IB and IIIA. Essentially, with changes such as these carried through for the compound film, the above description applies by analogy for Group IIB-IVA-VA compound films, including the same parts of the solar cell of FIG. 1 beyond the different compound film layer 12.

It, of course, will be readily apparent that many changes and modifications may be made in the methods and devices described in detail, depending upon the particular circumstance and application, without departing from the spirit or scope of the invention, as defined by the claims that follow and their equivalents.

What is claimed is:

1. A method for forming a compound film, comprising the steps of:
   (a) preparing a source material including oxide-containing particles including Group IB and IIIA elements;
   (b) depositing said source material on a base and forming a preparatory film from said source material;
   (c) heating said film in a suitable atmosphere to form a precursor film including non-oxide Group IB and IIIA elements; and
   (d) after the formation of said precursor film, providing suitable material to said precursor film to form a film including a Group IB-IIIA-VIA compound.

2. A method for forming a compound film as defined in claim 1 wherein:
   the ratio by number of moles of Group IB to Group IIIA elements in said source material is greater than about 0.6 and less than about 1.0.

3. A method for forming a compound film as defined in claim 1 wherein:
   the ratio by number of moles of Group IB to Group IIIA elements in said source material is substantially greater than 1.

4. A method for forming a compound film as defined in claim 3 wherein:
   the ratio by number of moles of Group IB to Group IIIA elements in said compound film is greater than about 0.6 and less than about 1.0.

5. A method for forming a compound film as defined in claim 1 wherein:
   oxides constitute greater than about 95 molar percent of the Group IB elements and greater than about 95 molar percent of the Group IIIA elements in said source material.

6. A method for forming a compound film as defined in claim 1 wherein:
   non-oxides constitute greater than about 95 molar percent of the Group IB elements and greater than about 95 molar percent of the Group IIIA elements in said precursor film.

7. A method for forming a compound film as defined in claim 1 wherein:
   said precursor film includes at least one group IB or Group IIIA element phase.

8. A method for forming a compound film as defined in claim 1 wherein:
   said oxide-containing particles include Group IB-IIIA-oxide containing particles.

9. A method for forming a compound film as defined in claim 1 wherein:
   the step of preparing a source material includes forming a powder including said oxide-containing particles.

10. A method for forming a compound film as defined in claim 9 wherein:
    said powder substantially has particle sizes of less than about 20 microns.

11. A method for forming a compound film as defined in claim 9 wherein:
    said powder substantially has particle sizes of less than about 2 microns.

12. A method of forming a compound film as defined in claim 1 wherein:
    each of said preparatory and precursor films has a single layer.

13. A method of forming a compound film as defined in claim 1 wherein:
    said compound film has a thickness of greater than about 0.5 micron and less than about 20 microns.

14. A method of forming a compound film as defined in claim 13 wherein:
    said compound film has a thickness of greater than about 1 micron and less than about 6 microns.

15. A method of forming a compound film as defined in claim 1 wherein the step of preparing a source material comprises:
    providing a powder including oxide-containing particles including Group IB and IIIA elements; and
    forming an ink including oxide-containing particles including Group IB and IIIA elements.

16. A method for forming a compound film as defined in claim 1 wherein:
    said oxide-containing particles contain Cu from Group IB and Group IIIA material selected from In or Ga.

17. A method for forming a compound film as defined in claim 16 wherein:
    said precursor film includes an alloy of Group IB and Group IIIA elements.

18. A method for forming a compound film as defined in claim 1 wherein:
    said oxide-containing particles including Group IB and IIIA elements are dispersed throughout the source material.

19. A method for forming a compound film as defined in claim 1 wherein:
    said oxide-containing particles include a dopant.

20. A method for forming a compound film as defined in claim 19 wherein:
    said dopant is an element selected from the group of Na, K, Li and Ce.

21. A method for forming a compound film as defined in claim 1 wherein:
    said source material includes a dopant.

22. A method for forming a compound film as defined in claim 1 wherein:
    said compound film includes a dopant.

23. A method for forming a compound film as defined in claim 1 wherein:
    said providing step includes heating said precursor film in a suitable atmosphere.

24. A method for fabricating an electronic device, comprising the steps of:
    (a) preparing a source material including oxide-containing particles including Group IB and IIIA elements;
    (b) depositing said source material on a base and forming a preparatory film from said source material;
    (c) heating said preparatory film in a suitable atmosphere to form a precursor film including non-oxide Group IB and IIIA elements; and
    (d) after the formation of said precursor film, providing suitable material to said precursor film to form a film including a Group IB-IIIA-VIA compound.

25. A method for fabricating an electronic device as defined in claim 24 wherein the step of preparing a source material comprises:

provided a powder including oxide-containing particles including Group IB and IIIA elements; and forming an ink including oxide-containing particles including Group IB and IIIA elements.

26. A method of fabricating an electronic device as defined in claim 24 wherein:

said providing step includes heating said precursor film in a suitable atmosphere.

27. A method for fabricating a solar cell, comprising the steps of:

(a) preparing a source material including oxide-containing particles including Group IB and IIIA elements;

(b) depositing said source material on a base and forming a preparatory film from said source material;

(c) heating said preparatory film in a suitable atmosphere to form a precursor film including non-oxide Group IB and IIIA elements; and (d) after the formation of said precursor film, providing suitable material to said precursor film to form a film including a Group IB-IIIA-VIA compound.

28. A method for fabricating a solar cell as defined in claim 27 wherein the step of preparing a source material comprises:

providing a powder including oxide-containing particles including Group IB and IIIA elements; and forming an ink including oxide-containing particles including Group IB and IIIA elements.

29. A method for fabricating a solar cell as defined in claim 27 wherein:

said providing step includes heating said precursor film in a suitable atmosphere.

30. A method for forming a compound, comprising the steps of:

(a) preparing a source material including particles containing one or more oxides selected from the group of oxides including Group IB and IIIA elements, and Group IIB and IVA elements;

(b) depositing said source material on a base and forming a preparatory film from said source material;

(c) heating said preparatory film in a suitable atmosphere to form a precursor film including Group IB and IIIA non-oxide elements for said first selected elements, and Group IIB and IVA non-oxide elements for said second selected elements; and (d) after the formation of said precursor film, providing suitable material to said precursor film to form a film including a compound selected from a Group IB-IIIA-VIA compound for said first selected elements, and a Group IIB-IVA-VA compound for said second selected elements.

31. A method for forming a compound film as defined in claim 30 wherein:

oxides of said selected elements for said source material constitute greater than about 95 molar percent of the first element of said selected elements and greater than about 95 molar percent of the second element of said selected elements, in said source material; and non-oxides of said selected elements for said precursor film constitute greater than about 95 molar percent of the first element of said selected elements and greater than about 95 molar percent of the second element of said selected elements, in said precursor film.

32. A method for forming a compound film as defined in claim 30 wherein:

said one or more oxides include a dopant.

33. A method for forming a compound film as defined in claim 30 wherein:

said source material includes a dopant.

34. A method for forming a compound film as defined in claim 30 wherein:

said compound film includes a dopant.

35. A method for forming a compound film as defined in claim 30 wherein:

said providing step includes heating said precursor film in a suitable atmosphere.

36. A method for forming a compound film as defined in claim 1 wherein:

said suitable atmosphere essentially does not contain any Group VIA elements other than oxygen.

37. A method for fabricating an electronic device as defined in claim 24 wherein:

said suitable atmosphere essentially does not contain any Group VIA elements other than oxygen.

38. A method for fabricating a solar cell as defined in claim 27 wherein:

said suitable atmosphere essentially does not contain any Group VIA elements other than oxygen.

39. A method for fabricating a solar cell as defined in claim 30 wherein:

said suitable atmosphere essentially does not contain any Group VIA elements for said first selected elements other than oxygen, and any Group VA elements for said second selected elements other than nitrogen.

* * * * *